United States Patent [19]

Nguyen

[11] Patent Number: 5,481,217
[45] Date of Patent: Jan. 2, 1996

[54] HIGH CURRENT TEST SIGNAL CONVERTER CIRCUIT

[75] Inventor: Dung Hieu Nguyen, Houston, Tex.

[73] Assignee: Houston Industries Incorporated, Houston, Tex.

[21] Appl. No.: 310,263

[22] Filed: Sep. 21, 1994

[51] Int. Cl.⁶ ........................................................ H03L 5/00
[52] U.S. Cl. ........................................ 327/333; 327/561
[58] Field of Search ..................................... 324/522, 523, 324/555; 327/65, 103, 108, 319, 335, 530, 536, 561, 563; 361/160, 170, 187; 363/51, 73; 330/252, 260, 295

[56]  References Cited

U.S. PATENT DOCUMENTS 4,132,954  1/1979  Sidhu ........................................ 327/561
4,804,910  2/1989  Russell ...................................... 324/120
5,270,898  12/1993 Elms et al. ................................. 361/96

OTHER PUBLICATIONS

Sedra & Smith, Microelectronic Circuits, Saunders College Publishing, Philadelphia 1991.

Primary Examiner—Timothy P. Callahan
Assistant Examiner—Jeffrey Zweizig
Attorney, Agent, or Firm—Pravel, Hewitt, Kimball & Krieger

[57]   ABSTRACT

An interface circuit for converting high current output signals provided by a test equipment to corresponding low voltage signals for testing digital relays used in power transmission systems. The high current signal outputs range in value between 0.001 and 26 amperes. The interface circuit includes a current sensing resistor for converting the high current output signal provided by the test equipment to a low voltage signal. The low voltage signal is amplified to the appropriate voltage level to correspond to the test equipment current signal output. The gain of the amplifier is adjustable using a potentiometer to allow the interface circuit to be used with different digital relays having different input signal requirements.

20 Claims, 1 Drawing Sheet

HIGH CURRENT TEST SIGNAL CONVERTER CIRCUIT

BACKGROUND OF THE INVENTION

1. Field of the Invention

The invention relates to testing digital relays used in power transmission systems, and more particularly, to an interface circuit for converting the high current signal outputs of test equipment to low voltage signals appropriate for use by digital relays.

2. Description of the Related Art

In modern high voltage power transmission systems, various types of protective equipment are used to respond to system faults such as short circuits. The protective equipment typically comprises three types of elements: transducers, relays and circuit breakers. When a fault is detected, the relays signal the appropriate circuit breakers to trip and isolate the faulty equipment. This protects not only the faulty equipment from further damage, but it also minimizes damage to the rest of the power transmission system.

The transducers are voltage and current transformers which transform high voltages and currents to a more manageable level for use by the relays. The output currents provided by these current transducers are referred to as secondary currents. The standard for the secondary current is five amperes in the United States, and one ampere in most European countries. Relays typically used are electro-mechanical relays that are responsive to the ratio of voltages and currents at the relay location.

Digital relays have been increasingly used in power systems due to their relative low cost and improved versatility. The digital relay includes a microcontroller or microprocessor to control the functions of the relay. With the advent of digital relays, transducers have been developed which transform the high-voltage power system signals to signals in the hundreds of millivolts RMS range. One such transducer is the magneto-optical current transducer (MOCT), whose output is at a voltage level of 200 mV RMS, which corresponds to the five-ampere output of a conventional current transducer. The low voltage signal output of the optical current transducer is provided to a digital relay, which samples the low voltage signal to determine the appropriate action to take.

One problem that has arisen with the use of such low voltage digital relays is the unavailability of proper test equipment. Most test equipment in use provides high current signal outputs for use with conventional electro-mechanical relays. Consequently, such test equipment cannot be used directly with the low voltage digital relays. However, purchasing new test equipment to provide the appropriate signal outputs would be very expensive. Thus, one solution that has been implemented is to use transformers as interface devices between the test equipment and the digital relay to convert the high current test signals to the appropriate voltage for use with the digital relay. However, transformers are passive devices that cannot easily be recalibrated to provide different voltage levels required by different digital relays.

SUMMARY OF THE INVENTION

Briefly, according to the present invention, a lower cost and more versatile apparatus has been developed to provide signal outputs having appropriate voltage levels for testing digital relays. With the present invention, an interface circuit is connected between the three-phase high current outputs of a test equipment designed for use with electro-mechanical relays and the low voltage inputs of a digital relay. The interface circuit includes current sensing means for converting the high current outputs of the test equipment to low voltage signals. The low voltage signals are then provided to corresponding amplifiers which generate signals having voltage levels corresponding to the five-ampere outputs of the test equipment. The amplified signals are provided to high speed buffering devices whose outputs are connected to the low voltage inputs of the digital relay. Another feature of the interface circuit is that the gain of the amplifiers are made adjustable using potentiometers. Depending upon the voltage levels required by different types of digital relays, the voltage levels of the signals generated by the amplifiers can be adjusted. Thus, the interface circuit allows a test equipment designed for use with electro-mechanical relays to be adapted for testing digital relays.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
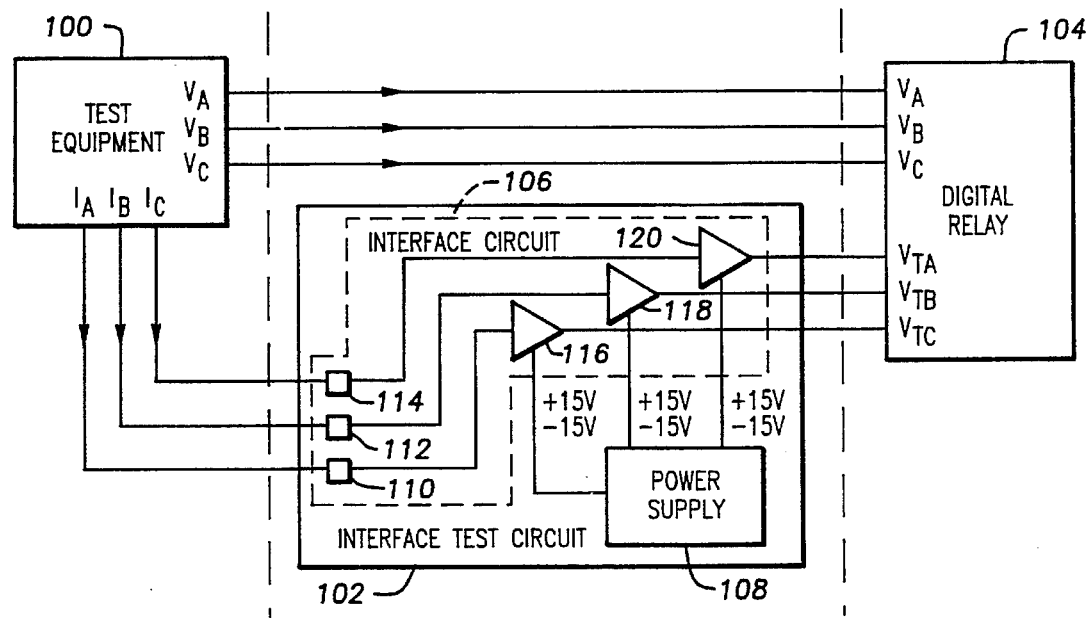
FIG. 1 shows an interface test circuit according to the present invention connected between a test equipment and a digital relay.

Referring now to FIG. 1, an interface test circuit 102 according to the present invention is shown connected between a test equipment 100 and a digital relay 104. The test equipment 100, which may be of several commercially available types, such as, for example, the F2000 series test equipment from Doble Engineering Company (Doble), is designed for use with conventional electro-mechanical relays. Thus, the three-phase current signal outputs $I_A$, $I_B$ and $I_C$ of the test equipment 100 range in value between 0.001 and 26 amperes. Higher current test equipment is also available from Doble that can generate up to a maximum of 160 amperes of output current. Such high current outputs are unacceptable for the digital relay 104, which may also be of several commercially available types, such as, for example, the MDAR from Asea Brown Bovery. To convert the high current signals to signals acceptable for use by the digital relay 104, the interface test box 102 is connected between the test equipment 100 and the digital relay 104.

The current signal outputs $I_A$, $I_B$ and $I_C$ from test equipment 100 are connected to inputs of the interface test circuit 102, which includes an interface circuit 106 and a power supply 108. The power supply 108 converts the external 120-volt alternating current (AC) voltage to direct current (DC) ±15-volt signals, which are designated as voltage signals +15 V and −15 V. The voltage signals +15 V and −15 V are provided to amplifying circuits 116, 118 and 120 in the interface circuit 106 for use as power supply voltages.

The inputs of the amplifying circuits 116, 118 and 120 are connected to the outputs of current sensing circuits 110, 112 and 114, respectively. The inputs of the current sensing circuits 110, 112, and 114 are connected to the signal outputs $I_A$, $I_B$ and $I_C$, respectively, of test equipment 100. The current sensing circuits 110, 112 and 114 convert the high current signals provided by the test equipment 100 into low voltage signals, which are then amplified by the corresponding amplifying circuits 116, 118 and 120. The amplified signals have voltage values which correspond to the current output of the test equipment 100, which range in value between 0.001 and 26 amperes.

In the preferred embodiment, five-ampere current signal outputs $I_A$, $I_B$ and $I_C$ are converted to 200 millivolt RMS signals and provided to low voltage inputs $V_{TA}$, $V_{TB}$ and $V_{TC}$ of the digital relay 104. The minimum input voltage that the digital relay 104 is capable of receiving is 20 millivolts, which corresponds to a 0.5-ampere secondary current. The maximum input voltage acceptable by the digital relay 104 is 8 volts, which corresponds to a secondary current of 200 amperes.

The test equipment 100 also provides three-phase voltages $V_A$, $V_B$ and $V_C$ to corresponding voltage inputs $V_A$, $V_B$, and $V_C$ of the digital relay 104. The test equipment 100 is capable of generating voltage values between ±0.01 and ±300 volts. Angles between the three-phase voltages $V_A$, $V_B$ and $V_C$ can be set at any suitable value by the test equipment 100.

Figure 2:
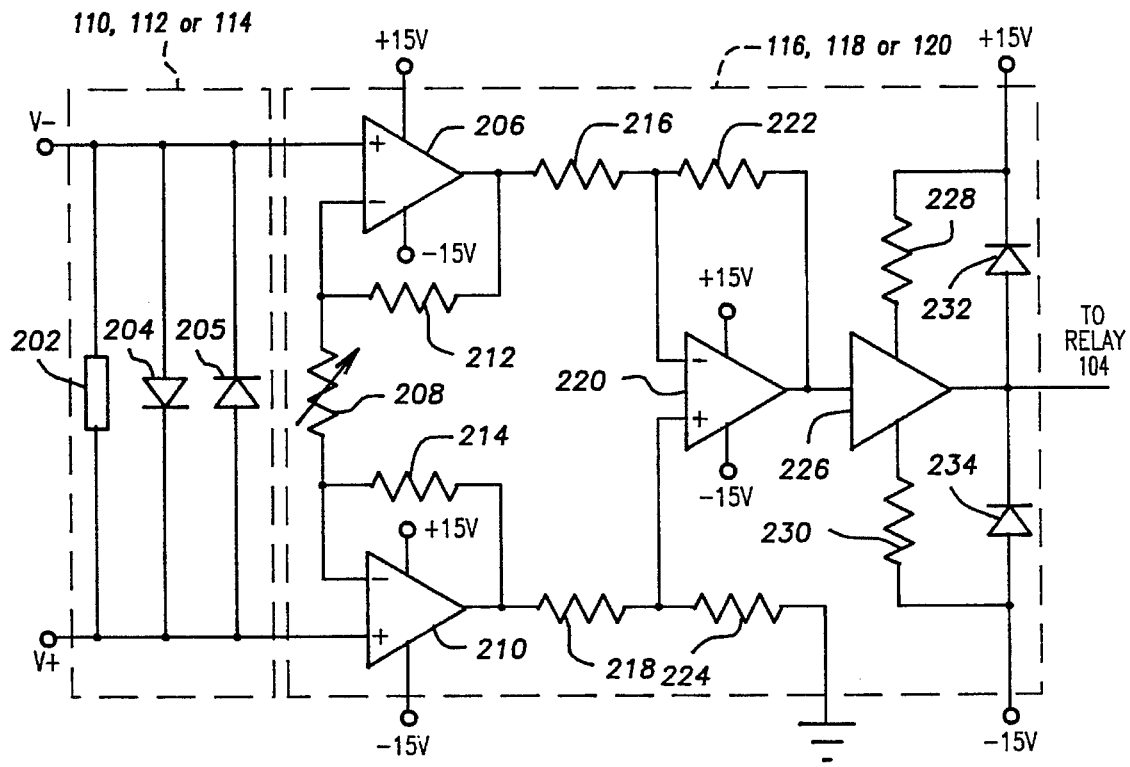
FIG. 2 is a more detailed schematic electrical circuit diagram of a portion of the interface test circuit in FIG. 1.

Referring now to FIG. 2, a circuit diagram of one of the current sensing circuits 110, 112 or 114 and its associated amplifying circuits 116, 118 and 120 in the interface circuit 106 is shown. Each of these current sensing circuits and its amplifying circuits in the interface circuit 106 is of like structural components and connections. Accordingly, only one of each is shown in detail. Each of the current sensing circuits 110, 112, or 114 comprises a current sensing resistor 202, which is connected between signals V+ and V−. The signal V+ is connected to one of the current signal outputs $I_A$, $I_B$ or $I_C$ provided by the test equipment 100. The voltage signal V− is connected to a common reference signal to which all the voltage values are measured. In the preferred embodiment, the current sensing resistor 202 is a 13-watt, 0.001-ohm four-terminal resistor. Thus, for every ampere of output current provided by the test equipment 100, the voltage difference between voltage signals V+ and V− is one millivolt.

The voltage signal V− is provided to the non-inverting input of an amplifier 206 in the amplifying circuit, and the voltage signal V+ is provided to the non-inverting input of an amplifier 210. All the amplifiers referred to herein are preferably conventional operational amplifiers or instrumentation amplifiers. The positive power supply terminal of the amplifiers 206 and 210 are connected to the voltage signal +15 V, while their negative supply terminals are connected to the voltage signal −15 V. A potentiometer 208 is connected between the inverting input of the amplifier 206 and the inverting input of the amplifier 210.

A resistor 212 is connected between the output of the amplifier 206 and its inverting input, and a resistor 214 is similarly connected between the output of the amplifier 210 and its inverting input. The output of the amplifier 206 is connected through a resistor 216 to the inverting input of an amplifier 220. The output of the amplifier 210 is connected through a resistor 218 to the non-inverting input of the amplifier 220. The positive and negative supply terminals of the amplifier 220 are also connected to the voltage signals +15 V and −15 V, respectively. A resistor 222 is connected between the output of the amplifier 220 and its inverting input. A resistor 224 is connected between the non-inverting input of the amplifier 220 and ground.

The output of the amplifier 220 is also connected to the input of a high speed buffer amplifier 226. The buffer amplifier 226 provides superior current driving capabilities than is available from the amplifier 220. The positive supply terminal of the amplifier 226 is connected through a resistor 228 to the voltage signal +15 V, and the negative supply terminal is connected through a resistor 230 to the voltage signal −15 V.

The effective gain of the amplifiers 206, 210 and 220 combined are determined by the values of the potentiometer 208 and the resistors 212, 214, 216, 218, 222 and 224. In the preferred embodiment, the gain of the amplifier is determined as 1+(50,000/R), where R represents the resistance value of the potentiometer 208 in ohms. The value of R is preferably set to obtain an effective gain of 40. However, by varying the resistance value of the potentiometer 208, the effective gain of the amplifiers can be adjusted. This provides the flexibility of allowing the interface test box 102 to be used with different types of digital relays. Although the preferred embodiment uses a potentiometer 208 to adjust the effective gain, it is noted that a programmable gain amplifier could be used instead.

For a five-ampere current signal output provided by the test equipment 100, the voltage difference developed between voltage signals V+ and V− is five millivolts. With an effective gain of 40, the voltage value of the output of the amplifier 220 is 200 millivolts RMS. This voltage value is provided by the buffer amplifier 226 to the appropriate one of the associated low voltage inputs $V_{TA}$, $V_{TB}$ or $V_{TC}$ of the digital relay 104.

The interface circuit 106 also includes certain protective devices in its current sensing circuits 110, 112 and 114 to protect the electrical components from damage due to high-voltage conditions. On the input side of the interface circuit 106, two diodes 204 and 205 are connected between voltage signals V+ and V−. The cathode of the diode 204 is connected to the signal V−, and its anode is connected to the signal V+. The diode 205 is connected in the opposite polarity, with its anode connected to the signal V− and its cathode connected to the signal V+. If the voltage difference between the signals V+ and V− reaches the turn-on voltage of the diodes 204 or 205, which is typically between 0.6 and 0.8 volts, the appropriate one of the diodes 204 and 205 will turn on to keep the voltage difference between V+ and V− at the diode forward bias voltage.

The output of the amplifying circuits 116, 118 and 120 in interface circuit 106 is protected by the resistors 228 and 230 and diodes 232 and 234. The anode of the diode 232 is connected to the output of the amplifier 226 and its cathode is connected to the voltage signal +15 V. The cathode of the diode 234 is connected to the output of the amplifier 226 and its anode is connected to the voltage signal −15 V. If the voltage value at the output of the buffer amplifier 226 exceeds one diode forward bias voltage above +15 volts, the diode 232 turns on to limit the output voltage to approximately 15.7 volts. Similarly, if the output voltage of the buffer amplifier 226 falls one diode forward bias voltage below −15 volts, the diode 234 turns on to limit the output of the amplifier 226 to approximately −15.7 volts. Thus, the diodes 232 and 234 act to limit large voltage transients or spikes that result from inductive loads, and which are seen at the output of the buffer amplifier 226, to between approximately −15.7 volts and +15.7 volts.

If a current overload or a short circuit condition occurs at the output of the buffer amplifier 226, the resistors 228 and 230 limit the amount of current that can pass through the buffer amplifier 226. As a result, the buffer amplifier 226 is protected from excessive current flow.

Thus the interface circuit according to the present invention transforms high current output signals provided by test equipment to corresponding low voltage signals for testing digital relays used in power distribution systems. The interface circuit includes a current sensing resistor for converting the high current output provided by the test equipment to a low voltage signal. The low voltage signal is amplified to a voltage level in the hundreds of millivolts range that corresponds to either the industry standard five-ampere or one-ampere current signal output and provided to the inputs of the digital relay. The gain of the amplifier is adjustable using a potentiometer to allow the interface circuit to be used with different digital relays having different input signal requirements.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. An interface circuit for transforming a high current signal provided by a testing device for testing electro-mechanical relays into a signal for connection to an input of a digital relay, wherein the digital relay is capable of receiving only low current and low voltage input signals, the circuit comprising:

means for receiving the high current signal from the testing device;

means connected to said receiving means for converting the high current signal into a low voltage signal;

amplifying means having a gain and being connected to said converting means for providing an amplified signal having a voltage that is a predetermined gain of said low voltage signal; and buffer means connected to said amplifying means for providing the digital relay input signal.

2. The interface circuit of claim 1, wherein the voltage of the high current signal is measured with respect to a reference signal, and wherein said signal converting means includes a current sensing means connected between the high current signal and said reference signal.

3. The interface circuit of claim 2, wherein said current sensing means is a current sensing resistor.

4. The interface circuit of claim 1, wherein said gain of said amplifying means is adjustable.

5. The interface circuit of claim 4, wherein said amplifying means includes a potentiometer to adjust said gain of said amplifying means.

6. The interface circuit of claim 1, wherein the digital relay includes a digital, high voltage, power transmission system relay.

7. The interface circuit of claim 6, wherein the digital relay accepts an input signal at voltage levels between zero and about plus or minus 8 volts.

8. The interface circuit of claim 1, wherein the magnitude of the high current signal provided by said test equipment is in the range between zero and about 160 amperes.

9. A system for testing a digital relay, wherein the digital relay is capable of receiving only low current and low voltage input signals, the system comprising:

a testing device for providing a high current signal;

an interface circuit coupled to said testing device for transforming said high current signal into a signal for connection to the digital relay, said interface circuit including:

means for receiving said high current signal;

means connected to said receiving means for converting said high current signal into a low voltage signal;

amplifying means having a gain and being connected to said converting means for providing an amplified signal having a voltage that is a predetermined gain of said low voltage signal; and buffer means connected to said amplifying means for providing the digital relay input signal.

10. The system of claim 9, wherein the voltage of said high current signal is measured with respect to a reference signal, and wherein said signal converting means includes a current sensing means connected between said high current signal and said reference signal.

11. The system of claim 10, wherein said current sensing means is a current sensing resistor.

12. The system of claim 9, wherein said gain of said amplifying means is adjustable.

13. The system of claim 12, wherein said amplifying means includes a potentiometer to adjust said gain of said amplifying means.

14. The system of claim 9, wherein the digital relay includes a digital, high voltage, power transmission system relay.

15. The system of claim 14, wherein the digital relay accepts input signals at voltage levels between zero and about plus or minus eight volts.

16. The system of claim 9, wherein said testing device includes a test equipment for testing electro-mechanical relays, said test equipment providing said high current signal.

17. The system of claim 16, wherein the magnitude of said high current signal provided by said test equipment is in the range between zero and about 160 amperes.

18. The system of claim 9, wherein the digital relay includes a digital, high voltage, power transmission system relay, and wherein said testing device includes a test equipment for testing electro-mechanical relays, said test equipment providing said high current signal.

19. An interface circuit for transforming a high current signal provided by a testing device into a signal for connection to an input of a digital, high voltage, power transmission system relay capable of receiving only low current and low voltage input signals, the circuit comprising:

means for receiving the high current signal;

means connected to said receiving means for converting the high current signal into a low voltage signal;

amplifying means having a gain and being connected to said converting means for providing an amplified signal having a voltage that is acceptable by the digital relay and that is a predetermined gain of said low voltage signal; and buffer means connected to said amplifying means for providing said amplified signal to the digital relay.

20. The interface circuit of claim 19, wherein said amplified signal is at a voltage between zero and about plus or minus 8 volts.

* * * * *